United States Patent [19]
Heidel et al.

[11] Patent Number: 6,108,798
[45] Date of Patent: *Aug. 22, 2000

[54] SELF PROGRAMMED BUILT IN SELF TEST

[75] Inventors: David F. Heidel, Mahopac; Wei Hwang, Armonk; Toshiaki Kirihata, Poughkeepsie, all of N.Y.

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/887,372

[22] Filed: Jul. 2, 1997

[51] Int. Cl.[7] .......................... G01R 31/28; G06F 13/26; G06F 11/27

[52] U.S. Cl. .................... 714/30; 714/733; 711/105

[58] Field of Search ................ 711/105; 714/30, 714/733

[56] References Cited

U.S. PATENT DOCUMENTS

| | | | |
|---|---|---|---|
| 5,161,232 | 11/1992 | Beran | 706/14 |
| 5,202,978 | 4/1993 | Nozuyama | 714/30 |
| 5,291,425 | 3/1994 | Nagaishi | 716/4 |
| 5,301,199 | 4/1994 | Ikenaga et al. | 714/732 |
| 5,303,199 | 4/1994 | Ishihara et al. | 365/225.7 |
| 5,355,509 | 10/1994 | Beran | 706/14 |
| 5,361,264 | 11/1994 | Lewis | 714/732 |
| 5,369,648 | 11/1994 | Nelson | 708/252 |
| 5,398,250 | 3/1995 | Nozuyama | 702/118 |
| 5,448,110 | 9/1995 | Tuttle et al. | 257/723 |
| 5,459,737 | 10/1995 | Andrews | 714/721 |
| 5,485,467 | 1/1996 | Golnabi | 714/726 |
| 5,504,903 | 4/1996 | Chen et al. | 713/1 |
| 5,509,019 | 4/1996 | Yamamura | 714/718 |
| 5,553,082 | 9/1996 | Connor et al. | 714/726 |
| 5,619,512 | 4/1997 | Kawashima et al. | 714/733 |
| 5,640,509 | 6/1997 | Balmer et al. | 714/30 |
| 5,668,816 | 9/1997 | Douskey et al. | 714/30 |
| 5,802,071 | 9/1998 | Fang et al. | 714/30 |

OTHER PUBLICATIONS

Hiroki Koike, et al, A Bist Scheme Using Microprogram ROM For Large Capacity Memories, IEEE 1990 International Test Conference, Paper No. 36.1, pp. 815–822.

Toshio Takeshima, et al, "A 55–NS 16–MB Dram With Built–In Self–Test Function Using Microprogram ROM", IEEE Journal of Solid–State Circuits, vol. 25, No. 4, Aug. 1990, pp. 903–911.

Primary Examiner—Reginald G. Bragdon
Attorney, Agent, or Firm—Whitham, Curtis, & Whitham; Joseph P. Abate, Esq.

[57] ABSTRACT

A memory (e.g. , Dynamic Random Access Memory (DRAM)) with self-programmable Built In Self Test (BIST). The DRAM, which may be a DRAM chip, includes a DRAM core, a Microcode or Initial Command ROM, a BIST Engine, a Command Register and a Self-Program Circuit. During self test, the BIST engine may test the DRAM normally until an error is encountered. When an error is encountered, the Self-Program Circuit restarts the self test procedure at less stringent conditions. Optionally, when the DRAM tests error-free, the Self-Program Circuit may restart testing at more stringent conditions to determine DRAM functionality limits.

15 Claims, 5 Drawing Sheets

SELF PROGRAMMED BUILT IN SELF TEST

RELATED APPLICATIONS

The present invention is related to U.S. patent application Ser. No. 08/887,374, now U.S. Pat. No. 5,764,655, entitled "Built In Self Test With Memory," and U.S. patent application Ser. No. 08/887,462, entitled "Method of Self Programmed Built In Self Test," both filed simultaneously herewith and both of which are assigned to the assignee of the present application and which are incorporated by reference in their entirety.

BACKGROUND OF THE INVENTION

1. Field of the Invention

The present invention generally relates to integrated circuits and, more particularly, to, for example, Dynamic Random Access Memories (DRAMs) with Built In Self Test (BIST) Capability.

2. Background Description

FIG. 1 is a block diagram of a typical page mode Dynamic Random Access Memory (DRAM) chip with Built In Self Test (BIST) capability. The chip includes a DRAM 100 and a conventional BIST engine 200 that tests the DRAM 100 according to commands defined in a Microprogram ROM 300.

The test program for this prior art BIST engine 200 may be varied only by changing microcode that is fixed permanently in the microprogram ROM 300. All test conditions and test sequences are unalterably stored in the microprogram ROM 300. Thus, regardless of BIST results, the entire microprogram must be executed. Even if more rigorous tests might be desired, they cannot be added without reprogramming the microprogram ROM 300.

SUMMARY OF THE INVENTION

It is therefore an object of the present invention to reduce memory (e.g., DRAM) test time.

It is another object of the present invention to improve the information available from memory (e.g., DRAM) self tests.

The present invention includes a memory (e.g., a Dynamic Random Access Memory (DRAM)) with a self-programmable Built In Self Test (BIST). The memory, which may be a memory (e.g., DRAM) chip, includes a memory core, a Microcode or Initial Command ROM, a BIST Engine, a Command Register and a Self-Program Circuit. The memory may also include current and temperature monitors to monitor current and temperature during test. Initially, the BIST engine tests the memory normally with preselected tests. However, after initial testing, subsequent tests are varied based on test history. So, the Self-Program Circuit may proceed with the self test at more or less stringent conditions.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

The preferred embodiment Dynamic Random Access Memory (DRAM) self test of the present invention may be better appreciated by reference to prior art Built In Self Test (BIST) for DRAMs.

Figure 1:
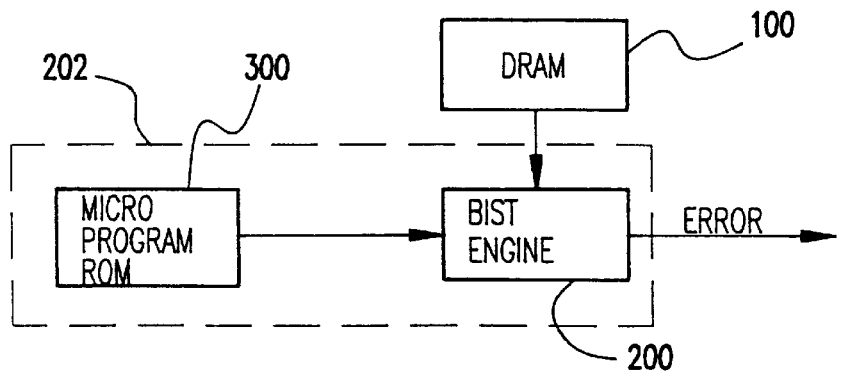
FIG. 1 is a block diagram of a typical page mode Dynamic Random Access Memory (DRAM) with a Built In Self Test (BIST) capability.
Figure 2:
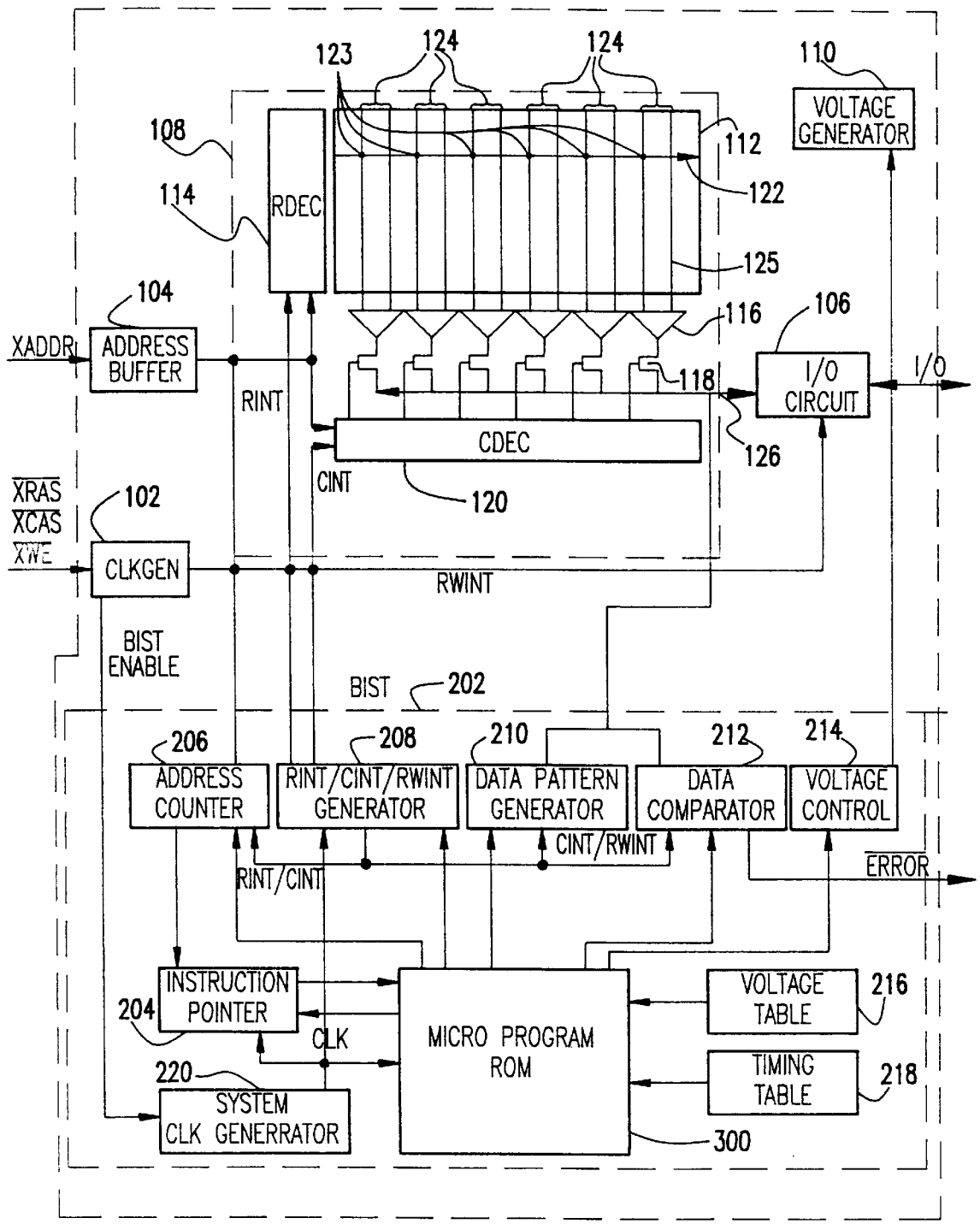
FIG. 2 is a more detailed schematic of the DRAM chip as in FIG. 1.

FIG. 2 is a more detailed schematic of the DRAM chip as in FIG. 1. The DRAM 100 includes CLocK GENerator (CLKGEN) 102, Address Buffer 104, Input/Output (I/O) circuit 106, DRAM core 108, and voltage generator 110. DRAM core 108 includes cell array 112, Row DECoder (RDEC) 114, sense amplifiers 116, column switches 118, and Column DECoder (CDEC) 120.

Three conventional control signals and ADDResses (XADDR) control DRAM 100. The control signals are: Row Address Strobe, $\overline{XRAS}$, which is negative active, as indicated by the inversion bar; Column Address Strobe, $\overline{XCAS}$, which is also negative active, as indicated by the inversion bar; and, Write Enable, $\overline{XWE}$, also negative active as indicated by the inversion bar. These three standard control signals control the DRAM in accordance with the function normally attributed to them.

Figure 3:
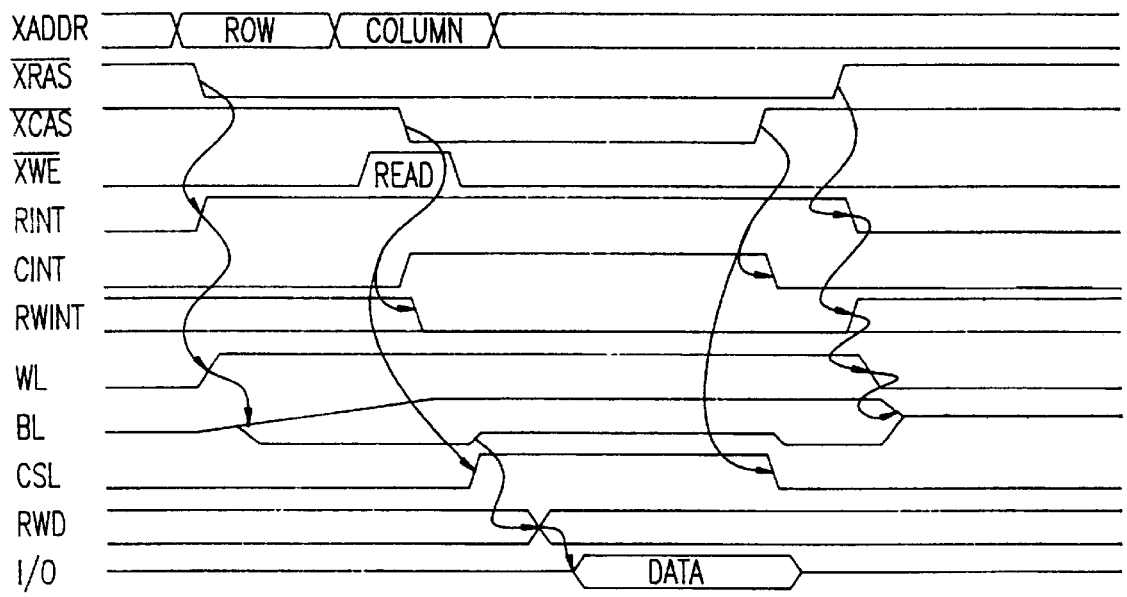
FIG. 3 is a timing diagram for the DRAM 100 of FIG. 2.

FIG. 3 is a timing diagram for the DRAM 100 of FIG. 2. When $\overline{XRAS}$ falls, CLKGEN circuit 102 generates an internal control signal, Row INTernal (RINT). Although not indicated schematically, RINT, in turn, activates Address Buffer 104. The output from Address Buffer 104 activates the word line decoder RDEC 114 which, in response to an address from XADDR, selects a Word Line (WL) 122 in the array 112. The selected Word Line 122 is driven high, coupling data stored in array cells 123 on the word line 122 to complementary Bit Line pairs (BL/$\overline{BL}$) 124. The coupled cell develops a small voltage on one line in the pair (BL/$\overline{BL}$) 124 to produce a voltage difference between BL 125 and $\overline{BL}$. After sufficient signal develops on BL/$\overline{BL}$ 124, sense amplifiers 116 are enabled, each one sensing data on an associated BL/$\overline{BL}$ pair 124. The sensed data is latched in the sense amplifiers.

Data latched in the sense amplifiers 116 is selected whenever $\overline{XCAS}$ falls. When $\overline{XCAS}$ falls, CLKGEN 102 generates an internal column control signal, Column INTernal (CINT).

The state of internal read/write signal, Read/Write INTernal (RWINT), is set by the state of $\overline{XWE}$ when $\overline{XCAS}$ falls. If $\overline{XWE}$ is high at the falling edge of $\overline{XCAS}$, RWINT remains low, setting the DRAM core 108 in read mode. If $\overline{XWE}$ is low at the falling edge of $\overline{XCAS}$, RWINT rises, setting the DRAM core 108 in write mode. Address Buffer 104 generates column address signals, which are passed to CDEC 120 to select and activate one column switch 118. The active column switch 118 passes data from one sense amplifier to/from I/O circuit 106 on the Read Write Drive line (RWD) 126. I/O circuit 106 passes data from RWD 126 off chip at I/O.

The BIST engine 200 and the Microprogram ROM 300 in FIG. 1 are included in BIST logic 202 in FIG. 2. Table 1 is an example of bit definitions for microinstructions for testing the above prior art DRAM chip. The BIST logic 202 is designed to generate DRAM internal signals RINT, CINT, RWINT, address, and a test data pattern without using $\overline{XRAS}$, $\overline{XCAS}$, $\overline{XWE}$, $\overline{XADDR}$, and I/O. The BIST engine 200 includes Instruction Pointer 204, Address Counter 206, RINT/CINT/RWINT Generator 208, Data Pattern Generator 210, Data Comparator 212, Voltage Control Logic 214, Voltage Table 216, Timing Table 218, and System Clock Generator 220. As indicated above, the BIST engine 200 is microprogram controlled by microcode stored in the microprogram ROM 300.

TABLE 1

Microinstruction bit definitions

| Bit No. | BIST Instruction: |
|---|---|
| $b_0$ | Test end |
| $b_1$ | Clear address counter and expected data pattern (set 0) |
| $b_2$ | Write mode |
| $b_3$ | Compare |
| $b_4$ | Invert data |
| $b_5$ | EXOR data |
| $b_6$ | Decrement YX |
| $b_7$ | Increment YX |
| $b_8$ | Else decrement Instruction Counter |
| $b_9$ | Repeat same command line until YX is either MAX or MIN address |
| $b_{12}$–$b_{10}$ | Voltages |
| $b_{15}$–$b_{13}$ | Timings |

Table 2 represents the steps in executing a test pattern known in the art as a MARCH pattern using the bit correspondence of Table 1. Self testing the prior art DRAM of FIG. 2 is initiated when $\overline{XWE}$ and $\overline{XCAS}$ occur before $\overline{XRAS}$, an occurrence or condition referred to in the art as Write and CAS Before RAS (WCBR). A WCBR occurrence places the DRAM in test mode, activates the BIST enable signal and isolates CLKGEN 102, Address Buffer 104 and I/O circuit 106 from the chip internal operation. Instead of passing the DRAM control clocks, CLKGEN 102 generates an internal CLOCK for the BIST engine 200. Internal voltages and timings are set dependent upon values in the voltage table 216 and the timing table 218 before each microinstruction is executed.

TABLE 2

March Pattern Test Instruction Sequence

| $b_{15}$  $b_{10}$ | $b_9$  $b_0$ | Test Step |
|---|---|---|
| 000000\| | 1000000010: | Clear |
| 000000\| | 1010000100: | Write (0) Inc. YX, If YX=MAX then Inc. IP |
| 000000\| | 1000000000: | Read (0) |
| 000000\| | 1110010100: | Write (1) Inc. YX, If YX = MAX Then Inc. IP Else Dec. IP |
| 000000\| | 0000011000: | Read (1) |
| 000000\| | 1110000100: | Write (0) Inc. YX, If YX = MAX Then Inc. IP Else Dec. IP |
| 000000\| | 0001000000: | Dec YX |
| 000000\| | 0000001000: | Read (0) |
| 000000\| | 1101010100: | Write (1) Dec. YX, If YX = O Then Inc. IP Else Dec. IP |
| 000000\| | 0000011000: | Read (1) |

TABLE 2-continued

March Pattern Test Instruction Sequence

| $b_{15}$  $b_{10}$ | $b_9$  $b_0$ | Test Step |
|---|---|---|
| 000000\| | 1101000100: | Write (0) Dec. YX, If YX = O Then Inc. IP Else Dec. IP |
| 000000\| | 0000000001: | Test End |

In Table 2, the first instruction is CLEAR, which clears the Address Counter 206 and Data Pattern Generator 210. Instruction Pointer (IP) 204 increments to one, initiating execution of the second microinstruction. RINT, generated by generator 208, activates the WL with initial address X=0. The sense amplifiers are set as in normal operation. After a predetermined delay, CINT from generator 208 activates Column Select Line (CSL) to select the first column, Y=0. RWINT is held low, indicating that the DRAM is in write mode. Data Pattern Generator 210 generates a zero, which is written to the selected cell.

After this first cycle, corresponding to command line 2, the Address Counter 206 increments the address to X=1, Y=0. Instruction Pointer 204 continues to point to command line two, because the Instruction Pointer 204 is not incremented until the YX=MAX. Accordingly, this prior art BIST engine repeats this write mode operation until address YX reaches MAX.

When YX=MAX, instruction 2 is complete, Instruction Pointer 204 is incremented, and the instruction 3 in the microprogram ROM 300 is selected. The address is reset to zero, re-selecting the initial WL with address X=0, coincident with driving RINT. After CINT is generated, data is transferred to Data Comparator 212. Data Comparator 212 compares the data read from array with an expected data which, at this step, is zero. If the read data and expected data match, no error is detected and $\overline{ERROR}$ remains high. If they do not match, an error is detected, which forces $\overline{ERROR}$ low.

After the compare, the Instruction Pointer 204 is incremented, initiating instruction 4. In executing Instruction 4, the previously written zeros are overwritten with ones starting at address zero, and incrementing. Then, the Instruction Pointer 204 is decremented, to point to instruction 3, so that address one may be checked for an expected one. The Instruction Pointer 204 is incremented again to overwrite one to the cell with address one. This operation is repeated until address YX reaches MAX. This operation, repeating instructions 3 and 4, continues until it is complete, regardless of results.

Figure 4:
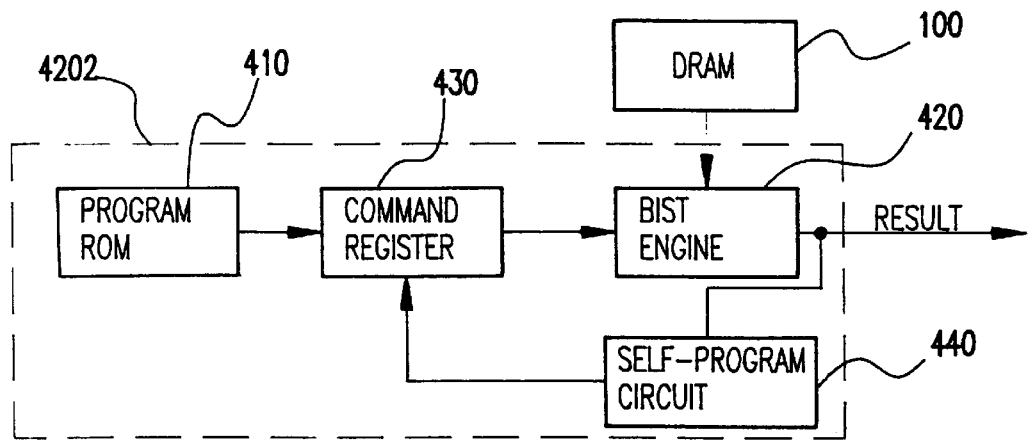
FIG. 4 is a block diagram of a DRAM with the preferred embodiment self-programmable BIST.

FIG. 4 is a block diagram of a preferred embodiment DRAM chip with self-programmable BIST according to the present invention. The chip includes a DRAM 100 (e.g., identical to that in FIG. 2); Microcode or Initial Command ROM 410; a BIST Engine 420; a Command Register 430; and a Self-Program Circuit 440.

For the preferred embodiment of FIG. 4, when a WCBR occurs initiating BIST, the Command Control Register 430 loads an initial command from the Microcode ROM 410. The BIST Engine 420 executes commands in the Command Control Register 430, testing the DRAM 100. After each test, test results are evaluated by the Self-Program Circuit 440, which loads the next command into the Command Register 430 based on the evaluation of the test results.

Figure 5:
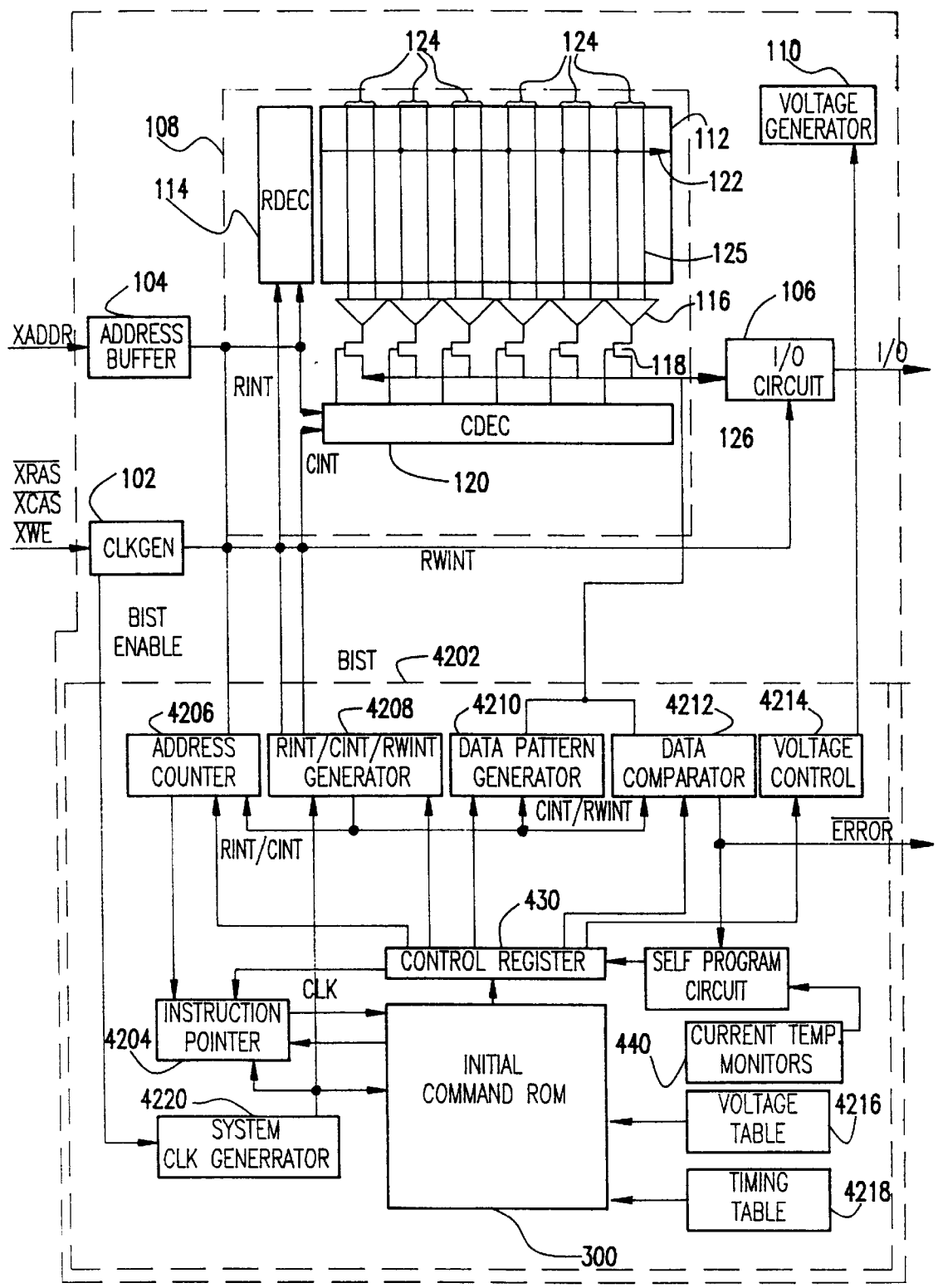
FIG. 5 is a detailed schematic diagram of the DRAM of FIG. 4.

FIG. 5 is a schematic diagram of a preferred embodiment DRAM chip with self-programmable BIST as in FIG. 4. In the schematic of FIG. 5, BIST logic 4202 includes the Initial Command ROM 410, the BIST Engine 420, the Command Register 430 and the Self-Program Circuit 440. In this embodiment, optional Current and Temperature Monitors 450 are included so that current, temperature and voltage may be monitored and included in BIST results. Self-Program Circuit 440 defines each test procedure according to previous BIST procedure results, as generated by the Data Comparator 4212 and Current and Temperature Monitors 450.

The Self-Program Circuit 440 controls voltages and timings in the Control Register 430, originally defined in the instructions (bits 10–12, and 13–15, in Table 1) provided from the Initial Command ROM 410. The Self-Program Circuit 440 also controls the Instruction Pointer 4204, loading a self-branch to a new initial test procedure, if necessary. For example, if test results are positive, indicating the chip passed the test, the Self-Program Circuit 440 changes bits 10–12 from 000 to 001. Accordingly, the subsequent test procedure has a new selected voltage set defined as 001 in Voltage Table 4216. Optionally, Self-Program Circuit 440 may control Voltage Control Circuit 4214 directly, incrementing the voltage by a predetermined value.

Figure 6:
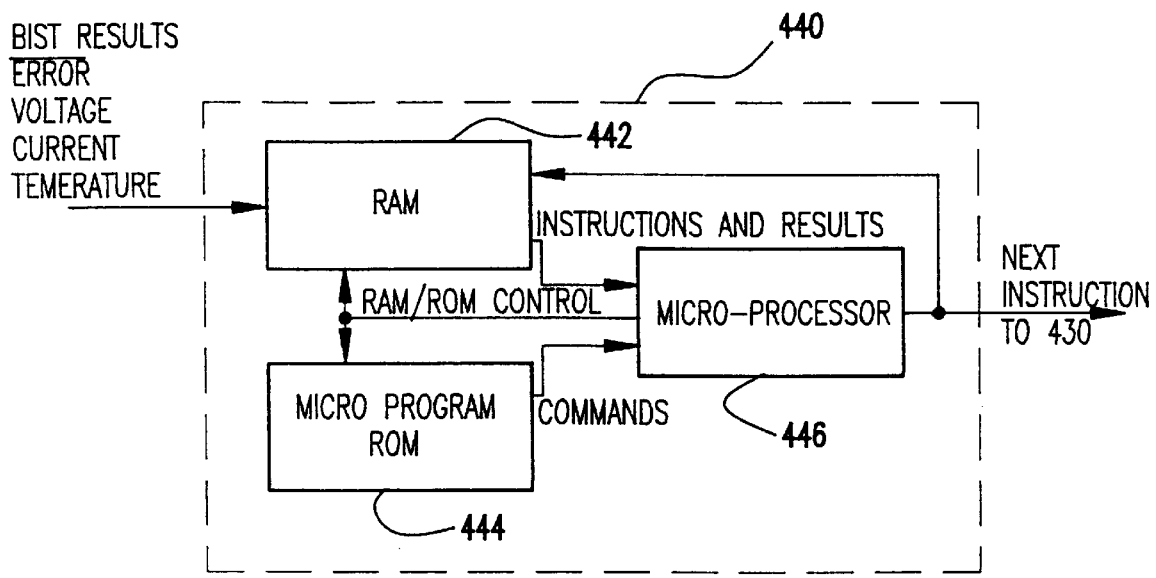
FIG. 6 is a block diagram of the self-program circuit.

FIG. 6 is a block diagram of the Self-Program Circuit 440, which includes RAM 442, Micro-Program ROM 444 and Microprocessor 446. RAM 442 stores test history, including BIST instructions and results of previous tests, as well as providing working storage for the Microprocessor 446. Test history, in addition to including comparator results, may include internal voltages, currents and chip temperature. It is crucial that the test history include several previously run BIST instructions and the results therefrom, in order to take advantage of the power of the Self Program Circuit 440 of the present invention. Microprogram ROM 444 contains microcode for directing the Microprocessor 446 in analyzing the test results.

The Microprocessor 446 analyzes the test history, i.e., previously run test results and BIST instructions in the RAM 442 and, based on that analysis, generates instructions for the next test, which instructions the Microprocessor 446 stores in the RAM 442. Besides analyzing BIST results, the Microprocessor 446 may define command priority whenever two or more commands produce identical results.

Figure 7:
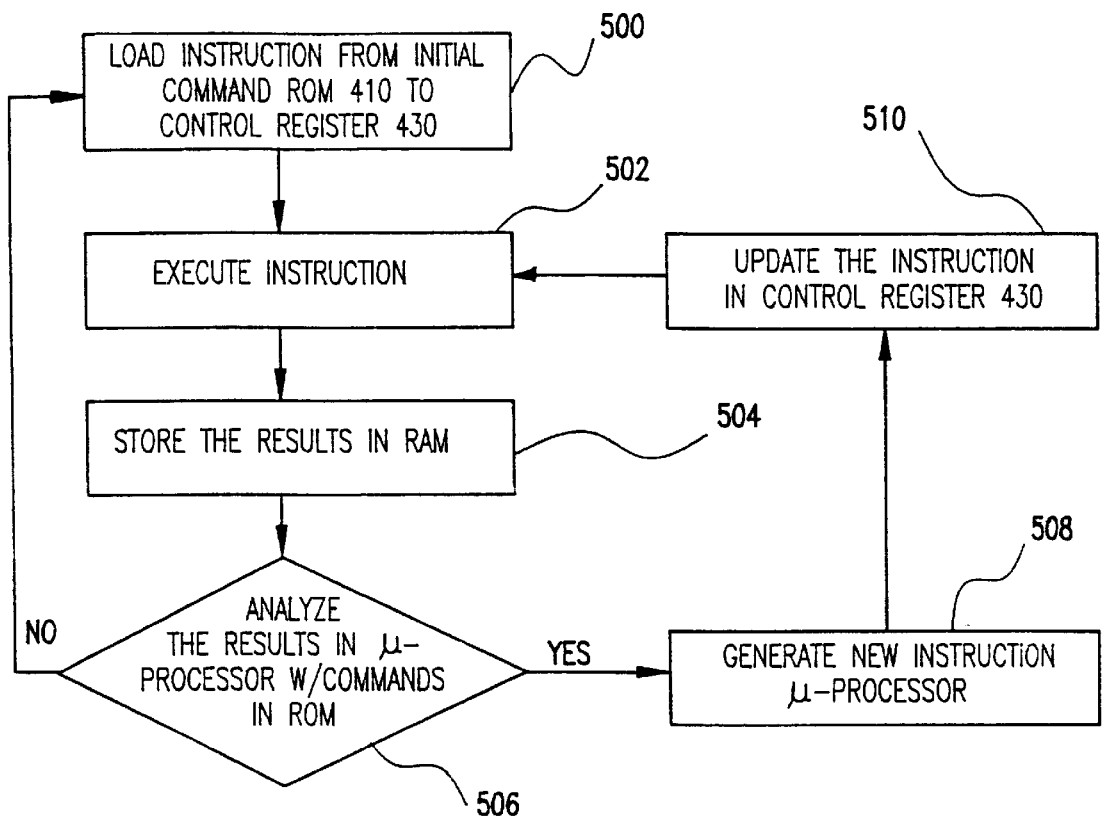
FIG. 7 shows a flow chart for the self-programmable BIST.

FIG. 7 is a flow chart for self-programmable BIST according to the preferred embodiment of the present invention. First, in step 500, an instruction is loaded from Initial Command ROM 410 into Control Register 430. The BIST Engine 420 executes the instruction in step 502 and stores the results in RAM 442 in step 504. In step 506, a determination is made from the stored results of whether the DRAM meets the test conditions. If the DRAM does not meet the current test conditions (NO) as defined in Microprogram ROM 444, then the sequence starts again with the next test in step 500. However, if the DRAM meets at least one of the test criteria (YES) in step 508, the Microprocessor 446 generates a new instruction. Finally, in step 510, the new instruction is passed to the BIST Engine 420 for execution in step 502.

SELF TEST EXAMPLE

So, for example, the preferred embodiment self programmed BIST may be employed to determine the functionality range of the DRAM chip. In this example, when the BIST is enabled, Control Register 430 loads the initial command for the first test procedure from the Initial Command ROM 410 with a MARCH pattern similar to the MARCH pattern in Table 2 and, the chip is tested according to the first procedure.

First, System Clock Generator 4220 generates an internal clock that enables the BIST logic 4202. Internal voltages and timings are selected before execution of each initial microinstruction from the Voltage Table 4216 and Timing Table 4218.

In this example, the first instruction is CLEAR, which clears the Address Counter 4206 and Data Pattern Generator 4210 to zero. Next, Instruction Pointer 4204 increments to one, initiating the second instruction. RINT from generator 4208 selects the first word line, X=0. After a predetermined delay, CINT from generator 4208 selects the first column, Y=0. RWINT is forced high indicating write mode. As a result, Data Pattern Generator 4210 generates a zero data pattern, which is written to the first selected cell. After this cycle, the Instruction Pointer 4204 points to 1, and Address Counter 4206 increments the address to X=1, Y=0. Instruction Pointer 4204 points to instruction 0, because the Instruction Pointer 4204 is not incremented until YX=MAX. Therefore, this write mode operation is repeated until address YX=MAX.

When YX=MAX, the Instruction Pointer 4204 is incremented to point to instruction 3 in the Initial Command ROM 410. RINT resets the address to zero, re-selecting the WL at address X=0. CINT causes the data to be transferred from the Array 124 to Data Comparator 4212. Data Comparator 4212 compares the read data from array with expected data, zero. To this point, this test sequence is identical to that of the prior art BIST engine.

In this example, however, for the preferred embodiment, if the Comparator 4212 results are negative, indicating an error, the Self-Program Circuit 440 resets the Instruction Pointer 4204 to zero, changes the bits (e.g., bits 10–12 to change voltage) in the Command Register 430, and the test is restarted to retest the chip at less severe test conditions, in this example, at more nominal voltages and more relaxed timing. Optionally, if test results are positive, the test parameters may be tightened to more severe test conditions to determine, for example, design margins.

If the Comparator 4212 results are positive, the Instruction Pointer 4204 is incremented, pointing to instruction 4. Instruction 4 causes the stored one to be overwritten in the first addressed cell, at address zero. Then, the address is incremented to one. Next, the Instruction Pointer 4204 is decremented to again point to instruction 3. So, the data at address 1 is checked against the expected data, i.e., a zero. As before, if the Comparator 4212 results are negative, the Self-Program Circuit 440 resets the Instruction Pointer 4204 to zero, changes bits (again bits 10–12 to change voltage) in the Control or Command Register 430, to retest the chip under less severe conditions.

Otherwise, test conditions may be tightened or testing can continue normally. So, the Instruction Pointer 4204 is incremented again to write a one to the next cell at address one. This is repeated until YX=MAX.

Self-programming commands passed to the Command Register 430 may include:

If the previous two BIST results are negative, then increment voltage by 0.1V;

If two sequential BIST results are positive followed by negative, then reduce RINT timing 0.1 ns;

If Vdd is 4.0V, then reset the Instruction Pointer 4204;

END upon the occurrence of five sequential negative results;

Calculate the average current over three sequential tests and reduce voltage by 0.1V whenever that running average exceeds 100 mA.

In this example if, after the MARCH test, the Comparator 4212 results are positive, the Self-Program Circuit 440 resets the Instruction Pointer 4204 to zero and resets the voltage command portion in the Control or Command Register 430 to retest the chip under more severe conditions, less favorable voltages and tighter timing conditions.

The test terminates under one of the following conditions:
1) The chip fails under least severe conditions, i.e., it is a Dead Chip.
2) The chip passes even under the most severe conditions, i.e., it is a Best Chip.
3) The chip fails after passing all test procedures for n times, i.e., it is a Rank "n" Chip.

Thus, the preferred embodiment of the present invention includes a more flexible BIST engine, wherein each test procedure is determined by previous BIST results. So, for the preferred embodiment self-programmable BIST, an initial test is performed to determine the chip's best operating conditions. As each test is run, if the test results are positive, more severe test conditions are applied and the chip is retested. When test results are negative, the test conditions are relaxed and the chip is retested. Thus, redundant tests are eliminated, while the reliability of the results of each completed test is improved. This is a significant improvement over the prior art BIST engines that cannot be changed without reprogramming the microcode in the ROM (e.g., ROM 300).

While the invention has been described in terms of preferred embodiments, those skilled in the art will recognize that the invention can be practiced with modification within the spirit and scope of the appended claims.

For example, the ROMs 410, 444 may be erasable and programmable such as EEPROM or FLASH EEPROM. Also, the present invention may be implemented with another type of volatile memory core (e.g., SRAM, SDRAM), or with a non-volatile memory core (e.g., ROM, EEPROM, FLASH MEMORY, NVRAM), or even with another type of integrated circuit.

Suitable BIST Engines, Command Registers, Command ROMs, Self-Program Circuits, and any other hardware or software, for realizing these implementations are well within the skill of the art when taken in conjunction with the teachings of the present specification and drawing figures.

What is claimed is:

1. A Dynamic Random Access Memory (DRAM) comprising:
   a DRAM core;
   a Built-In Self Test (BIST) engine connected to control said DRAM core during a test condition;
   a command register for providing control commands to said BIST engine; and
   a self-program circuit for selectively providing commands for alteration of test conditions to said command register in response to a result of a control command previously provided to said BIST engine from said command register to determine best operating conditions for said DRAM.

2. The DRAM of claim 1, wherein the BIST engine is configured to provide a test result to said self-program circuit and said self program circuit is configured to provide commands to said command register responsive to said test result.

3. The DRAM of claim 2, further comprising an initial command store for providing commands to said command register.

4. The DRAM of claim 3, wherein the BIST engine comprises:
   an address counter;
   a instruction pointer;
   a control signal generator for providing control signals to said DRAM and to said address counter;
   a clock generator for supplying a clock signal to said control signal generator, said initial command store and said instruction pointer;
   a data pattern generator for supplying test patterns to said DRAM core; and,
   a data comparator for comparing supplied patterns with data read from said DRAM core and for providing said test results.

5. The DRAM of claim 4, wherein the BIST engine further comprises a voltage control for selecting a test voltage of said DRAM core.

6. A DRAM chip comprising the DRAM of claim 5.

7. The DRAM of claim 2, wherein the self-program circuit comprises:
   a RAM, said test result being stored in said RAM; and
   a microprocessor unit including a microprocessor for interrogating said result, determining a next BIST instruction therefrom and providing said next BIST instruction to said command register, said microprocessor unit including a microprogram ROM for providing commands to said microprocessor.

8. A DRAM chip comprising:
   a DRAM core;
   a Built-In Self Test (BIST) engine connected to control said DRAM core during a test condition;
   an initial command store;
   a command register for receiving commands from said initial command store for providing controls commands to said BIST engine; and
   a self-program circuit for selectively providing commands for alteration of test conditions to said command register in response to a result of a command previously provided to said BIST engine from said command register to determine best operating conditions for said DRAM chip.

9. The DRAM chip of claim 8, wherein the initial command store is a Read Only Memory (ROM).

10. The DRAM chip of claim 9, wherein the BIST engine is configured to provide a test indication to said self-program circuit and said self program circuit is configured to provide a command to said command register responsive to said test indication.

11. The DRAM chip of claim 10, further comprising a test parameter monitor for monitoring at least one test parameter and for supplying test condition information to said self program circuit.

12. The DRAM of claim 11, wherein the BIST engine comprises:
   an address counter;
   a instruction pointer;
   a control signal generator for providing control signals to said DRAM and to said address counter;
   a clock generator for supplying a clock signal to said control signal generator, said initial command store and said instruction pointer;
   a data pattern generator for supplying test patterns to said DRAM core; and
   a data comparator for comparing supplied patterns with data read from said DRAM core and for providing said test indication.

13. The DRAM of claim 12, wherein the self-program circuit comprises:

a RAM, said test indication being stored in said RAM; and a microprocessor unit including a microprocessor for interrogating said results, determining a next BIST instruction therefrom and providing said next BIST instruction to said command register, said microprocessor unit including a microprogram ROM providing commands to said microprocessor.

14. A memory comprising:

a memory core;

a built in self test engine connected to control said memory core during a test condition;

a register for providing a command to said built in self test engine; and a self-program circuit for selectively providing a command for alteration of test conditions to said register in response to a result of a command previously provided to said built in self test engine from said register to determine best operating conditions for said memory.

15. A chip comprising:

a target circuit;

a built in self test engine connected to control said target circuit during a test condition;

a register for receiving for providing a command to said built in self test engine; and a self-program circuit for selectively providing a command for alteration of test conditions to said register in response to a result of a command previously provided to said built in self test engine from said register to determine best operating conditions for said chip.

* * * * *

UNITED STATES PATENT AND TRADEMARK OFFICE
CERTIFICATE OF CORRECTION

PATENT NO.: 6,108,798
DATED: August 22, 2000
INVENTORS: David F. Heidel, Wei Hwang and Toshiaki Kirihata It is certified that error appears in the above-identified patent and that said Letters Patent is hereby corrected as shown below.

At column 1, line 7, change serial number "08/887,462" to read - -08/887,464- -.

Signed and Sealed this

Fifteenth Day of May, 2001

Attest:

NICHOLAS P. GODICI

Attesting Officer     Acting Director of the United States Patent and Trademark Office